United States Patent
Schmitt et al.

(10) Patent No.: US 12,157,955 B2
(45) Date of Patent: Dec. 3, 2024

(54) METHOD FOR SIMULTANEOUSLY MANUFACTURING MORE THAN ONE SINGLE CRYSTAL OF A SEMICONDUCTOR MATERIAL BY PHYSICAL VAPOR TRANSPORT

(71) Applicant: SiCrystal GmbH, Nuremberg (DE)

(72) Inventors: Erwin Schmitt, Großenseebach (DE); Michael Vogel, Nuremberg (DE)

(73) Assignee: SiCrystal GmbH, Nuremberg (DE)

( * ) Notice: Subject to any disclaimer, the term of this patent is extended or adjusted under 35 U.S.C. 154(b) by 16 days.

(21) Appl. No.: 18/068,980

(22) Filed: Dec. 20, 2022

(65) Prior Publication Data
US 2023/0120928 A1    Apr. 20, 2023

Related U.S. Application Data

(63) Continuation of application No. 16/894,428, filed on Jun. 5, 2020, now Pat. No. 11,560,643.

(30) Foreign Application Priority Data

Jul. 3, 2019    (EP) .................................... 19184262

(51) Int. Cl.
C30B 23/02     (2006.01)
C30B 23/00     (2006.01)
(Continued)

(52) U.S. Cl.
CPC .......... C30B 23/005 (2013.01); C30B 23/063 (2013.01); C30B 29/36 (2013.01); C30B 35/002 (2013.01)

(58) Field of Classification Search
CPC ..... C30B 23/00; C30B 23/002; C30B 23/005; C30B 23/02; C30B 23/063; C30B 25/00;
(Continued)

(56) References Cited

U.S. PATENT DOCUMENTS 5,707,446 A    1/1998  Volkl et al.
7,279,040 B1 *  10/2007  Wang ...................... C30B 23/00
                                                          117/83
(Continued)

FOREIGN PATENT DOCUMENTS

CN    201545935 U1    8/2010
CN    103781946 A1    4/2014
(Continued)

OTHER PUBLICATIONS

European Search Report, dated Nov. 21, 2019, 7 pages, for EP 19184262.
(Continued)

*Primary Examiner* — Kenneth A Bratland, Jr.
(74) *Attorney, Agent, or Firm* — Barley Snyder

(57) ABSTRACT

A method for simultaneously manufacturing more than one single crystal of a semiconductor material by physical vapor transport (PVT) includes connecting a pair of reactors to a vacuum pump system by a common vacuum channel and creating and/or controlling, with the vacuum pump system, a common gas phase condition in the inner chambers of the pair of reactors. Each reactor has an inner chamber adapted to accommodate a PVT growth structure for growth of a semiconductor single crystal.

15 Claims, 13 Drawing Sheets

(51) Int. Cl.
*C30B 23/06* (2006.01)
*C30B 29/36* (2006.01)
*C30B 35/00* (2006.01)

(58) Field of Classification Search
CPC ......... C30B 25/02; C30B 25/08; C30B 25/16; C30B 29/00; C30B 29/10; C30B 29/36; C30B 35/00; C30B 35/002; C30B 35/005
USPC ... 117/88, 93, 101–102, 200, 204, 902, 937, 117/951, 84–86
See application file for complete search history.

(56) References Cited

U.S. PATENT DOCUMENTS

| | | |
|---|---|---|
| 8,865,324 B2 | 10/2014 | Straubinger et al. |
| 9,236,281 B2 | 1/2016 | Bakke et al. |
| 10,801,126 B2 | 10/2020 | Drachev et al. |
| 2005/0268852 A1* | 12/2005 | Hatanaka ........ C23C 16/45551 118/723 VE |
| 2007/0065994 A1 | 3/2007 | Chen |
| 2007/0151509 A1* | 7/2007 | Park ................... C01B 21/0722 117/200 |
| 2012/0058630 A1 | 3/2012 | Quinn et al. |
| 2016/0138185 A1 | 5/2016 | Hori et al. |
| 2017/0321345 A1 | 11/2017 | Xu et al. |
| 2018/0002828 A1* | 1/2018 | Loboda ................... C30B 29/36 |
| 2021/0002787 A1 | 1/2021 | Schmitt et al. |

FOREIGN PATENT DOCUMENTS

| | | |
|---|---|---|
| CN | 105316654 A1 | 2/2016 |
| CN | 105518187 A1 | 4/2016 |
| EP | 1852528 A1 | 11/2007 |
| GB | 2423307 A | 8/2006 |
| JP | 2007308364 A | 11/2007 |
| JP | 2010037189 A * | 2/2010 |
| JP | 2016009724 A | 1/2016 |
| JP | 2016531836 A | 10/2016 |
| JP | 201839715 A | 3/2018 |
| KR | 10-2017-0034812 * | 3/2017 |
| KR | 20170034812 A | 3/2017 |
| WO | 2015035140 A1 | 3/2015 |

OTHER PUBLICATIONS

Official Action from the Japanese Patent Office in Patent Appln. No. 2020-038473, dated Sep. 7, 2021, and English translation thereof, 17 pp.

Chinese Office Action with English Translation, Application No. 202010413386.4, Dated: Dec. 28, 2021, 25 pages.

* cited by examiner

METHOD FOR SIMULTANEOUSLY MANUFACTURING MORE THAN ONE SINGLE CRYSTAL OF A SEMICONDUCTOR MATERIAL BY PHYSICAL VAPOR TRANSPORT

CROSS-REFERENCE TO RELATED APPLICATIONS

This application is a continuation of U.S. patent application Ser. No. 16/894,428, filed on Jun. 5, 2020, which claims the benefit of the filing date under 35 U.S.C. § 119(a)-(d) of European Patent Application No. 19184262.4, filed on Jul. 3, 2019.

FIELD OF THE INVENTION

The present invention relates to systems and methods for growing bulk semiconductor single crystals and, more particularly, for simultaneously growing more than one bulk semiconductor single crystal, such as silicon carbide, based on physical vapor transport.

BACKGROUND

Silicon carbide (SiC) is extensively used as a semiconductor substrate material for electronic components in a wide range of applications, such as power electronics, radio frequency and light emitting semiconductors components. Physical vapor transport (PVT) is generally used for growing bulk SiC single crystals, and in particular, for commercial purposes. The SiC substrates are produced by cutting slices from the bulk SiC crystal (for e.g. using wire saws) and finishing the slice surface with a sequence of polishing steps. The finished SiC substrates are employed in the manufacturing of semiconductor components, such as in epitaxial processes where thin monocrystalline layers of a suitable semiconductor material (e.g., SiC, GaN) are deposited onto the SiC substrate. The characteristics of the deposited monolayers and the components produced therefrom depend crucially on the quality and homogeneity of the underlying substrate. For this reason, the outstanding physical, chemical, electrical and optical properties of SiC makes it a preferred semiconductor substrate material for power device applications.

PVT is a crystal growing method that essentially involves sublimation of a suitable source material followed by re-condensation at a seed crystal, where the formation of the single crystal takes place. The source material and seed crystal are placed inside a growth structure, where the source material is sublimed by heating. The sublimed vapor then diffuses in a controlled manner due to a temperature gradient established between source material and seed crystal and deposits onto the seed to grow as a single crystal.

Conventional PVT-based growth systems generally employ either inductive or resistive heating systems for subliming the source material. In both cases, the core of the PVT-based growth system is the so-called reactor. The growth structure, conventionally made of insulating, graphite and carbon materials, is placed in the interior of the reactor and heated by either induction coils arranged outside the reactor or by resistive heaters arranged inside the reactor. The temperature within the growth structure is measured by one or more pyrometers or by one or more thermocouples installed close to an overture of the growth structure. The vacuum-sealed reactor is evacuated by one or more vacuum pumps and supplied with inert or doping gases via one or more gas feeds to create a controlled gas (gas mixture atmosphere). All process parameters (pressure, temperature, gas flow, etc.) can be adjusted, controlled, and stored by a computer-operated system controller, which communicates with all involved components (for e.g. inverter, pyrometer, vacuum control valve, MFC, and pressure gauges as will be detailed below with reference to FIG. 3).

In the case of inductively-heated PVT systems, the reactor usually includes one or more glass tubes, which are optionally cooled with water and provided at both ends with flanges to complete the interior of the reactor against the atmosphere. An example of such an inductively heated PVT system is described in U.S. Pat. No. 8,865,324 B2. The induction coil is mounted outside the glass tubes and usually surrounded by a "Faraday cage" to shield the electromagnetic radiation. In conventional resistively-heated PVT systems, the heating resistive elements are mounted inside the reactor. In case the reactor is made of metal, it can be cooled by water or air. Examples of resistively-heated PVT systems are described in published patent applications US 2016/0138185 and US 2017/0321345.

At present, these and other conventional PVT growth systems with components similar to those mentioned above are based on a single reactor concept which allows only one growth structure to be introduced at a time in the reactor. This limits the number of single crystals that can be produced at a time and leads to several disadvantages in terms of homogeneity in the quality of the obtained crystals as well as economic costs. Namely, growth rates associated with conventional PVT techniques are typically in the range of a few 100 μm/h, which is rather slow to meet the needs of large scale production. In order to increase the production rate of bulk single crystals, several "isolated" PVT systems could be run at the same time. However, this implies high costs associated with the need of providing separate vacuum, gas supply and control components for running each reactor, and space requirements.

Moreover, the concept of using "isolated" PVT growing systems also has a negative impact on the homogeneity of the crystals produced therein. For instance, doping of SiC crystals achieved by introducing nitrogen gas in the reactor chamber is highly dependent on pressure and flow parameters of the doping gas mixture. This might lead to significant differences in doping level due to process fluctuations in a same reactor system or process differences among reactor systems. The growth rate of SiC single crystals is also largely dependent on the pressure prevailing during crystal growth inside the reactor (in addition to temperature). Consequently, single crystals produced in such "isolated" reactor systems can greatly differ in their respective properties, such as doping level and crystal length, when produced in similar, independent reactor systems using a same set of control parameters (pressure, temperature, growth time, etc.) due to slight differences among reactor systems (for e.g. suction power of the pump, deviation or drift of the pressure measuring systems, etc.), or even on a same reactor at different runs due to fluctuations of the control parameters during the growth process. This results in undesirable rejections and quality loss of the produced single crystals.

The prior art describes systems for crystal growth, each consisting of only one reactor, which is provided for each PVT structure and each system is controlled or supplied individually with the corresponding vacuum, heating, gas supply and controls. So far, the disadvantages described above that such an "isolated" crystal growing system (single system) entails have been accepted.

SUMMARY

A method for simultaneously manufacturing more than one single crystal of a semiconductor material by physical vapor transport (PVT) includes connecting a pair of reactors to a vacuum pump system by a common vacuum channel and creating and/or controlling, with the vacuum pump system, a common gas phase condition in the inner chambers of the pair of reactors. Each reactor has an inner chamber adapted to accommodate a PVT growth structure for growth of a semiconductor single crystal.

BRIEF DESCRIPTION OF THE DRAWINGS

Further features and advantages will become apparent from the following and more detailed description of the invention, as illustrated in the accompanying drawings, in which.

DETAILED DESCRIPTION OF THE EMBODIMENT(S)

Figure 1:
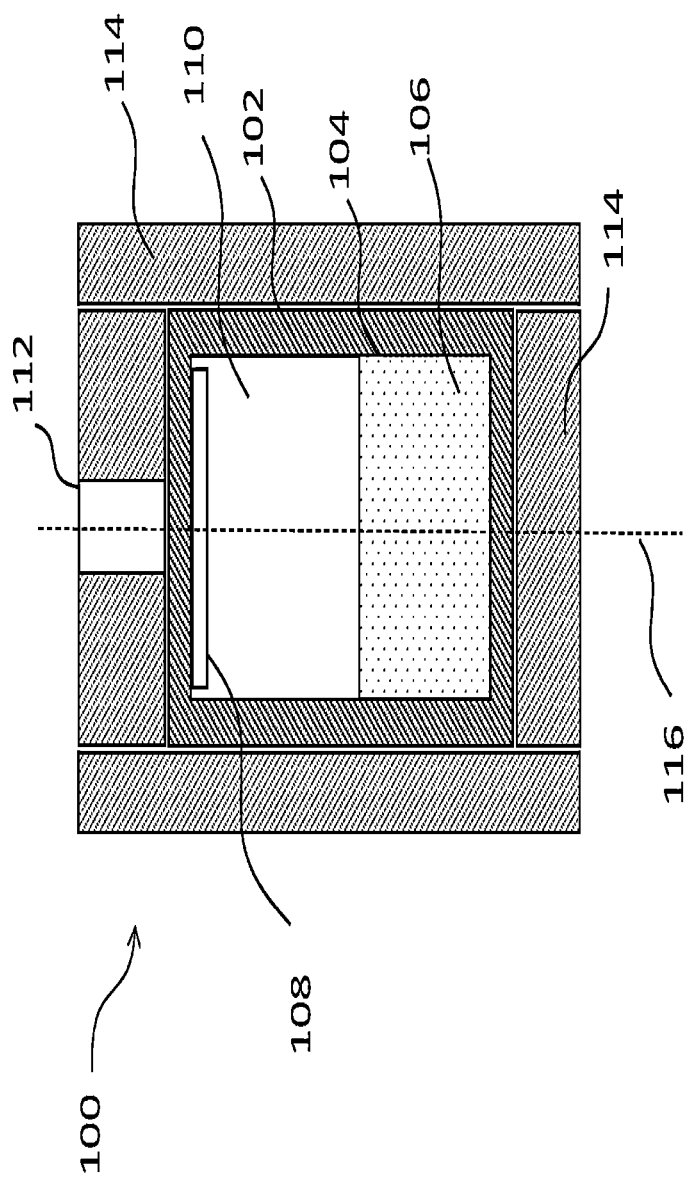
FIG. 1 is a sectional view of a PVT growth structure for growing a single crystal by physical vapor transport.

The present invention will now be more fully described hereinafter with reference to the accompanying drawings, in which exemplary embodiments of the invention are shown.

The present invention may, however, be embodied in many different forms and should not be construed as limited to the embodiments set forth herein. Rather, these embodiments are provided so that the disclosure will convey the scope of the invention to those skilled in the art. Like numbers refer to like elements in the drawings throughout the specification.

The present invention will be described hereafter with reference to silicon carbide, however, it is envisaged to apply the principles of the present invention to the growth of single crystals, grown by physical vapor transport methods, using other semiconductor materials such as AN and other group III-V semiconductor materials.

As mentioned above, the concept of the present invention may be advantageously extended to all known physical vapor transport (PVT) growth systems that are based on the "isolated" reactor concept and using PVT growth structures known in the art, namely, PVT growth structures that can receive only one PVT growth structure for growing single crystal(s) at a time.

FIG. 1 is a diagrammatic, sectional view of a PVT growth structure 100 for growing a single crystal boule, such as SiC, by a physical vapor transport method. The PVT growth structure 100 comprises a crucible 102, having a source material compartment 104 containing a SiC source material 106 (for e.g. in powder or granular form), on a lower side of the crucible 102. A seed crystal 108 is arranged in a growth region or growth compartment 110 on an upper side of the crucible 102, at a certain distance from the SiC source material 106. In an embodiment, the source material 106 is a semiconductor material of a group including at least silicon carbide, 4H SiC, and a semiconductor of group III-V elements.

The seed crystal 108 is cooled via a respective heat dissipation channel 112 on top of the crucible 102, as shown in FIG. 1. Temperature of the seed crystal 108 may be monitored by suitable temperature sensors, such as a pyrometer, situated on or close to the heat dissipation channel 112. The crucible 102, in an embodiment, is made from a porous material, such as graphite, to allow doping components in gaseous form, such as Nitrogen, or an inert gas to enter into the growth compartment 110 through the crucible walls by porosity. The temperature required for subliming the SiC source material 106 is achieved by applying heat using inductive or resistive heating devices situated at the exterior of the PVT growth structure 100. The crucible 102 is, in an embodiment, made of electrically and thermally conductive graphite crucible material with a density of, for example at least 1.75 g/cm3. The PVT growth structure 100 also includes one or more thermal insulation layers 114 that covers the crucible 102 almost entirely, with the exception of the heat dissipation channel 112. The thermal insulation layer 114 may be made of a porous, thermal insulating material, such as foam-like graphite, with a porosity higher than that of the crucible graphite material. This configuration allows to grow one single crystal boule at a time.

Figure 2:
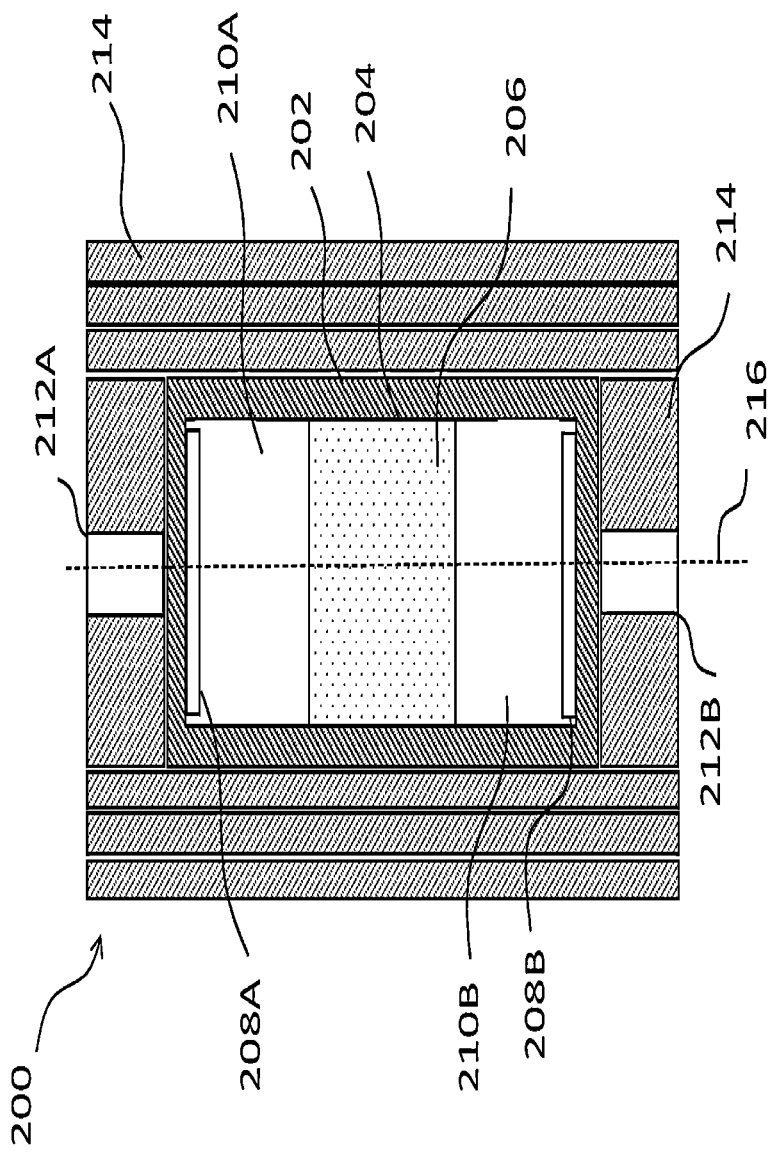
FIG. 2 is a sectional view of a PVT growth structure according to another embodiment for growing two single crystals simultaneously.

FIG. 2 shows a configuration of a PVT growth structure 200 for growing two single crystal boules of a semiconductor material, such as SiC, simultaneously. The PVT growth structure 200 comprises a crucible 202 where a source material compartment 204 for the SiC source material 206 is provided in a central region that separates the crucible growth region in an upper and a lower growth compartment 210A and 210B. Seed crystals 208A and 208B are arranged in the separate growth compartments 210A and 210B, respectively, at a certain distance from the source material compartment 204. Each of the seed crystals 208A, 208B is cooled via a respective heat dissipation channel 212A, 212B to create a temperature gradient that transports the SiC vapor sublimed from the source material 206 towards the seeds 208A, 208B in the upper and lower growth compartments 210A and 210B.

The PVT growth structure 200 shown in FIG. 2 allows growing two single crystal boules, from a same SiC source material 206, simultaneously. Given the relative orientation of the seeds 208A, 208B with respect to the source material compartment 204, single crystal growth takes place in the direction of a longitudinal axis 216 of the crucible 202, from top to bottom in the upper growth compartment 210A and from bottom to top in the lower growth compartment 210B. Each of the upper and lower growth compartments 210A and 210B may be separated from the SiC source material 206 by a gas permeable porous barrier to ensure that only gaseous Si and C containing components enter the growth compartments 210A and 210B. Similarly to the PVT growth structure 100 described above with reference to FIG. 1, the crucible 202 is made from a porous material in an embodiment, such as graphite, through which the upper and lower growth compartments 210A, 210B receive a doping gas or an inert gas. In addition, the PVT growth structure 200 may include one or more thermal insulation layers 214 which covers the crucible 202, with the exception of the heat dissipation channels 212A, 212B.

Different types of conventional PVT growth systems based on the "isolated" reactor concept to which the concept of the present invention may be applied are described below with reference to FIGS. 3-5. Either one of the PVT growth structures 100, 200 described above with reference to FIGS. 1-2 may be used in any of these PVT growth systems.

Figure 3:
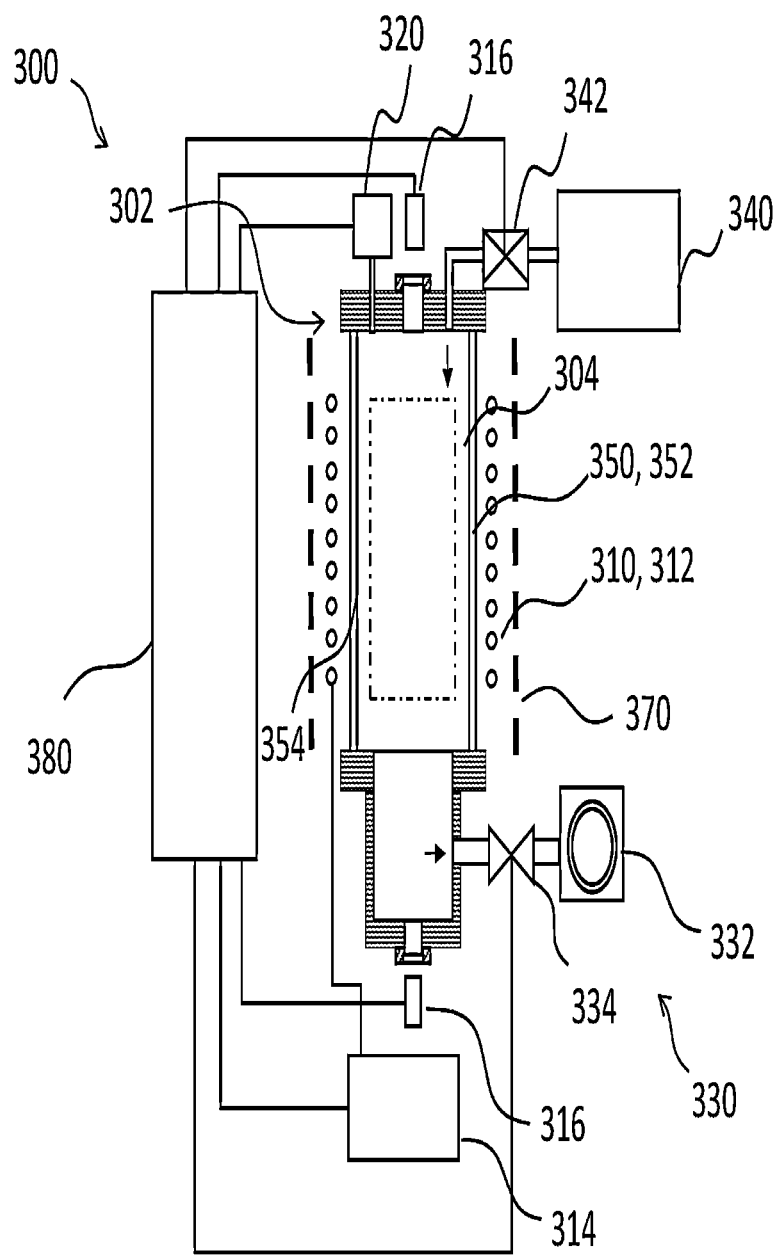
FIG. 3 is a schematic diagram of a system for growing a semiconductor crystal boule by PVT.

FIG. 3 shows a conventional PVT growth system 300 having a single reactor 302 with an inner chamber 304 for growing the single crystal(s) under controlled temperature and vacuum conditions. The PVT growth system 300 includes an inductive heating system 310 arranged around the reactor 302 to heat the source material inside the PVT growth structure 304 to a suitable growth temperature. The inductive heating system 310 is generally provided as an induction coil 312, winded on the outside of the reactor 302 along the reactor longitudinal axis and connected to a MF generator/inverter 314 that supplies a controlled current to the induction coil 312. The flow of this controlled current in the induction coil 312 induces the flow of electric current in the electrically conductive wall of the crucible of the PVT growth structure 304, which generates sufficient heat to sublime the source material placed inside the crucible. For instance, temperatures of more than 2000° C., and particularly, of about 2200° C., are generally used for PVT growth of SiC single crystals. The height of the induction coil 312 may be adjustable to allow fine-tuning of the source material temperature and temperature gradients established inside the PVT growth structure 304. The temperature reached inside the PVT growth structure 304 may be measured using one or more temperature sensors 316, such as pyrometers or thermocouples, located close to the heating channels of the PVT growth structure 304.

The PVT growth system 300, as shown in FIG. 3, also includes one or more pressure measuring systems 320, possibly a combination of pressure measuring devices, for measuring the pressure reached inside the reactor inner chamber 304. In order to create an appropriate atmosphere for the single crystal growth, the PVT growth system 300 includes a vacuum pump system 330 with one or more vacuum/extraction pumps 332 (for e.g. a vacuum pump and/or a high vacuum pump) and an adjustable control valve 334 for controlling the suction power of the vacuum pump 332. In addition, the PVT growth system 300 includes a gas supply 340 for supplying one or more gaseous compounds (such as gaseous inert and doping elements, e.g. Ar and N) to the reactor inner chamber 304 to create a suitable doping or inert atmosphere for single crystal growth. The gas supply 340 may be an interface to compressed gas cylinders provided on site or to a central gas supply. The supply of doping and inert gases to the reactor 302 is individually controlled by one or more MFCs, as appropriate. The PVT growth system 300 also includes a water cooling system 350, in general provided as two concentric and internally water-cooled glass tubes 352, 354, for dissipating the heat generated in the reactor 302.

The reactor 302 and inductive heating system 310 are in general enclosed in a shield or Faraday cage 370, shown in FIG. 3, to reduce electromagnetic radiation. Further components of the PVT growth system 300 includes metal flanges for sealing the reactor 302, including glass inserts for measuring the temperature by pyrometers (not shown).

The above and other controllable process parameter systems of the PVT growth system 300 are controlled by a system controller 380, which adjusts the growth process parameters and records all data of the single crystal growth process, such as pressure, temperature, position of the induction coil, cooling water temperature, and the like. Exemplary operation of a PVT growth system of the type illustrated in FIG. 3 is fully described in U.S. Pat. No. 8,865,324 B2, and therefore, it will not be further detailed here.

Figure 4:
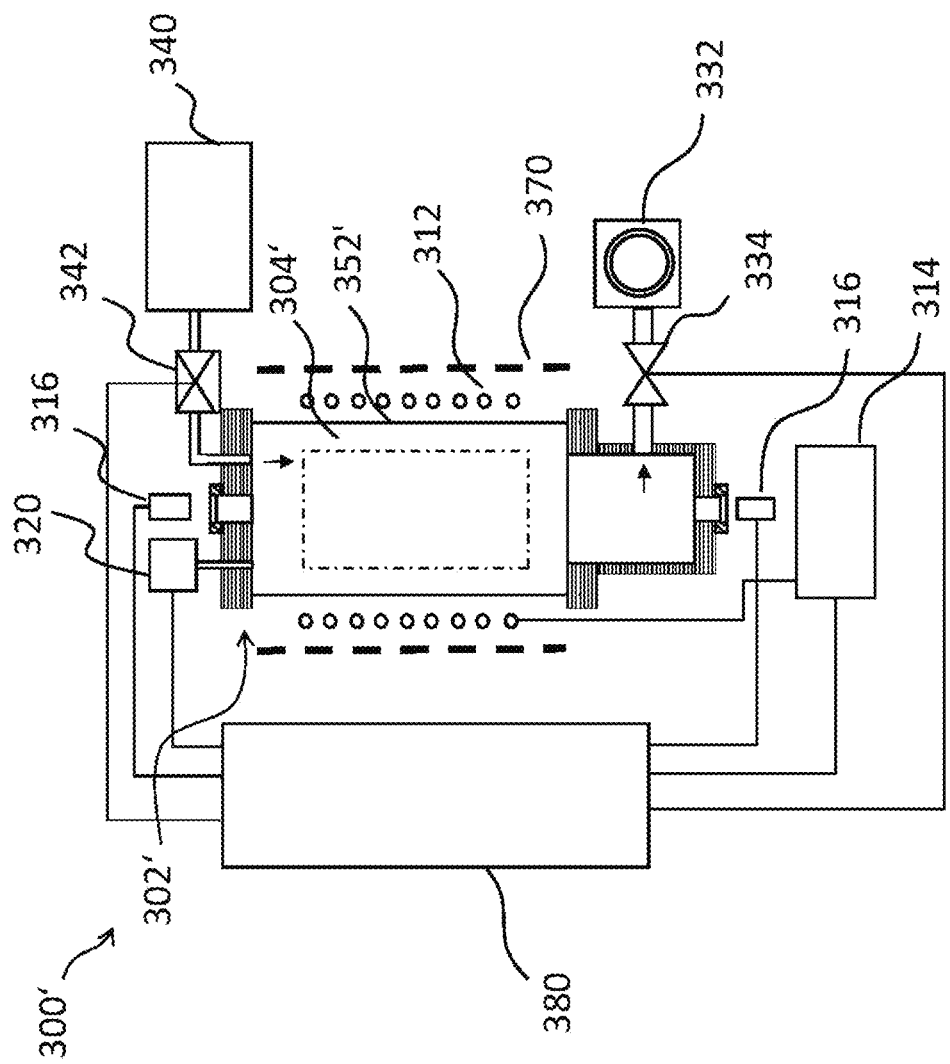
FIG. 4 is a schematic diagram of a system for growing a semiconductor crystal boule by PVT according to another embodiment.

FIG. 4 shows another conventional system 300' for growing semiconductor crystal boules by PVT. The PVT growth system 300' essentially differs from the PVT system 300 illustrated in FIG. 3 in that it comprises a reactor 302' with a single glass tube 352'. In this case, the dissipation of heat from the reactor 302' is not achieved by water cooling but rather by a flux of air, which is passed around the outer edge of the glass tube 352' in a controlled manner.

Figure 5:
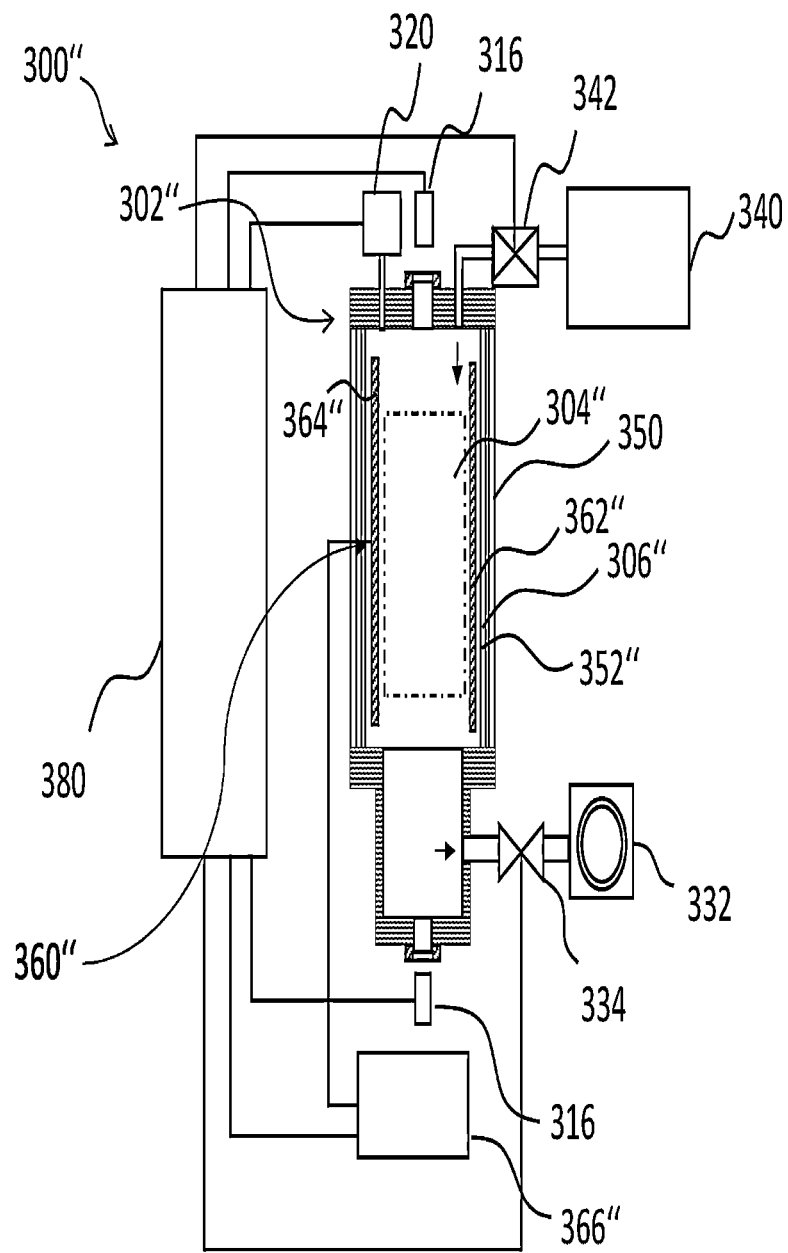
FIG. 5 is a schematic diagram of a system for growing a semiconductor crystal boule by PVT according to another embodiment.

FIG. 5 shows another configuration of a PVT growth system 300", which uses a resistive heating system 360" instead of the inductive heating system 310 described above. The resistive heating system 360" includes resistive heating elements 362", 364" mounted inside the reactor 302". A heating current control unit 366" supplies current to the resistive heating elements 362", 364" to heat the reactor inner chamber 304" in a controlled manner and achieve a suitable growth temperature. The reactor 302" may be made with walls 306" of metal and provided with a water cooling system 350 such as the one described above with reference to FIG. 3. Alternatively, an air cooling system, such as the one described above with reference to FIG. 4, may be used.

Further combinations and variations of the PVT crystal growing systems described above are known, but which are all based on the single, "isolated" reactor concept with its associated shortcomings and disadvantages.

PVT crystal growing systems based on the concept of a common vacuum channel that connects several reactors to a common vacuum system and which are centrally controlled for achieving substantially the same vacuum conditions in all reactors at the start of the growth process and for maintaining a same gas phase condition during simultaneous growth of single crystals in all reactors will now be described with reference to FIGS. 6-13.

Figure 6:
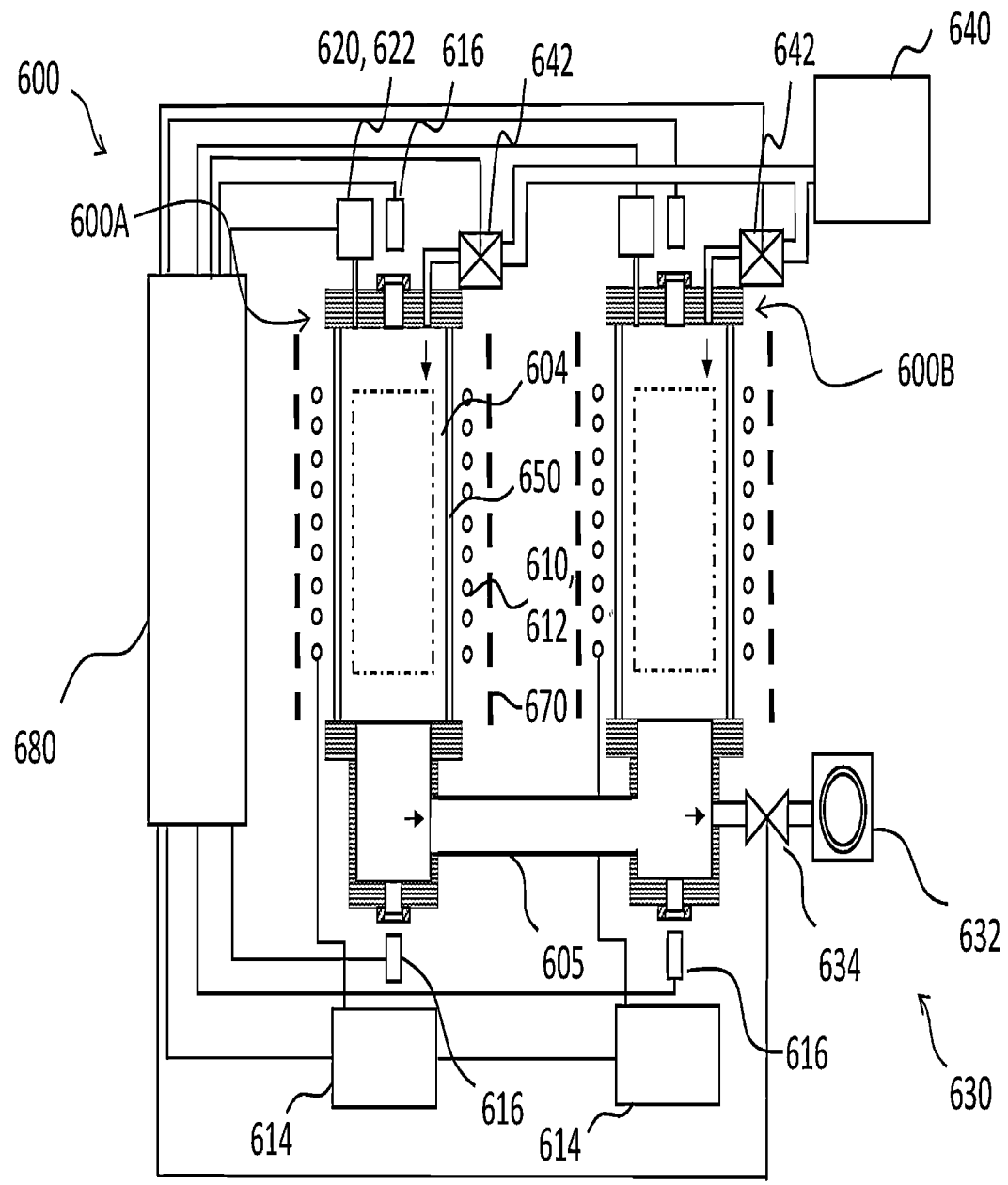
FIG. 6 is a schematic diagram of a PVT growth system having a pair of reactors connected to a common vacuum channel according to an embodiment.

FIG. 6 shows a PVT growth system 600 comprising a pair of reactors 600A and 600B for simultaneously growing more than one semiconductor single crystal and which are connected to each other via a common vacuum channel 605. The reactors 600A, 600B, in an embodiment, are of a same type, such as to be operated at a same gas phase composition (N and/or Ar) and pressure conditions during the growth of single crystals. The common vacuum channel 605 connects the two reactors 600A and 600B to a common vacuum pump system 630 in a serial manner so that one of the reactors is directly connected to the vacuum pump 632 whereas the other reactor(s) is evacuated via the common vacuum channel 605. This allows creating and controlling a gas phase composition (N and/or Ar) in the inner chambers 604 with a same pump system 630 while ensuring that a substantially same gas phase composition (N and/or Ar) can be achieved and maintained in both reactors 600A, 600B during the growth process.

The vacuum conditions and/or pressure in the inner chambers 604 are centrally controlled by the system controller 680 via an adjustable control valve 634 provided between the vacuum pump 632 and the reactor 600B at the end of the vacuum channel 605 closer to the vacuum pump 632. Thus, the pressure inside the inner chambers 604 of reactors 600A, 600B can be controlled simultaneously in a centralized manner and without the need of separate vacuum systems and controllers for each reactor, as in conventional PVT growth systems based on the "isolated" reactor concept. As shown in FIG. 6, the reactors 600A and 600B are of a same type as of the PVT growth system 300 described above with reference to FIG. 3. However, two or more reactors of this or other types, such as the reactors of the PVT growth systems 300' and 300" described above, may be connected to a common pump system via a common vacuum channel as shown in FIG. 6 to achieve the advantages of the present invention.

The PVT growth system 600 also includes a pressure measurement system 620 having one or more pressure sensors 622 that may be arranged in at least one of the reactors 600A, 600B to perform measurements indicative of a pressure reached in the respective inner chambers 604. A suitable doping or inert gaseous atmosphere for the single crystal growth is achieved in the inner chambers of each reactor 600A, 600B by supplying the gaseous components that form the doping/inert gaseous atmosphere in the inner chambers 604 via individual gas feeds from a gas supply 640, and which are individually controlled by the system controller via dedicated mass flux controllers (MFC) 642. The pressure measurement system 620 monitors the pressure measured by the pressure sensor(s) 622, and outputs vacuum control parameters for controlling the adjustable control valve 634 of the vacuum pump system 630 to regulate the pressure inside the inner chambers 604 to a predetermined growth pressure. The pressure measurement system 620 outputs also gas phase control parameters, based on the monitored pressure, for the MFCs 642 controlling the supply of the gaseous components into the inner chambers 604, such as to achieve and maintain predetermined gas phase conditions (i.e. pressure and composition of the doping/inert gas atmosphere), which are substantially the same, over all the inner chambers 604 connected via the common vacuum channel 605.

In the embodiment shown in FIG. 6, each reactor 600A, 600B has a dedicated heating system 610 to heat a PVT growth structure arranged inside the reactor inner chamber 604, and which are of a same type. The heating system 610 is controlled to reach the required temperature conditions in both reactors 600A, 600B individually and using individual growth process parameters for each reactor 600A, 600B. The heating system 610 includes heating inductive coils 612 that are controlled by the system controller via a dedicated MF generator 614. The temperature reached in the inner chambers 604 may be measured and monitored using suitable temperature sensors 616, which are controlled by the system controller. In addition, the reactors 600A, 600B are provided with respective cooling systems 650, which are individually controlled and/or monitored by the system controller, for dissipating heat from the respective reactors 600A, 600B. The cooling system 650 may be similar to the water cooling system 350 described above with reference to FIG. 3, and may be individually controlled and/or monitored to ensure proper heat dissipation from the reactors 600A, 600B.

The operation of the inductive heating system 610, cooling system 650, and temperature control is essentially the same as in the conventional PVT growth system 300 described above with reference to FIG. 3, and may be controlled individually or using a common controller or PC, in order to save space and equipment costs. However, the growth process parameters that play a major critical role in the final properties of the grown single crystal(s), i.e. pressure and composition of the doping/inert gas phase, are controlled in a central manner by the same system controller 680 which, under monitorization by the pressure measurement system 620, adaptively adjusts the pressure inside the inner chambers 604 via control of the single adjustable control valve 634 connected to the common vacuum channel 605 and the amount of the gaseous components fed into the inner chambers 604 from the gas supply 640 via control of the individual MFCs 642. This allows to achieve a better control and reproducibility of the critical growth process parameters in comparison with PVT growth systems based on the conventional "isolated" reactor concept.

In addition, each of the reactors 600A, 600B may have a movable bottom flange, i.e. on a lower side of the reactor 600A, 600B to which the vacuum channel 605 is also connected, that can be displaced along a longitudinal axis of the respective reactor inner chamber 604 for removing and/or bringing the PVT growth structure into the inner chamber 604 from this lower side. As a consequence, a PVT growth structure may be easily inserted and removed from the reactor inner chamber 604, thereby facilitating the replacement of the PVT growth structure in the plurality of reactors after each run of a growth process, and without the need of dismantling the doping/inert gas feeds which are generally provided on the top side of the reactors 600A, 600B, i.e. opposed to the site to which the vacuum channel 605 is connected.

Figure 7:
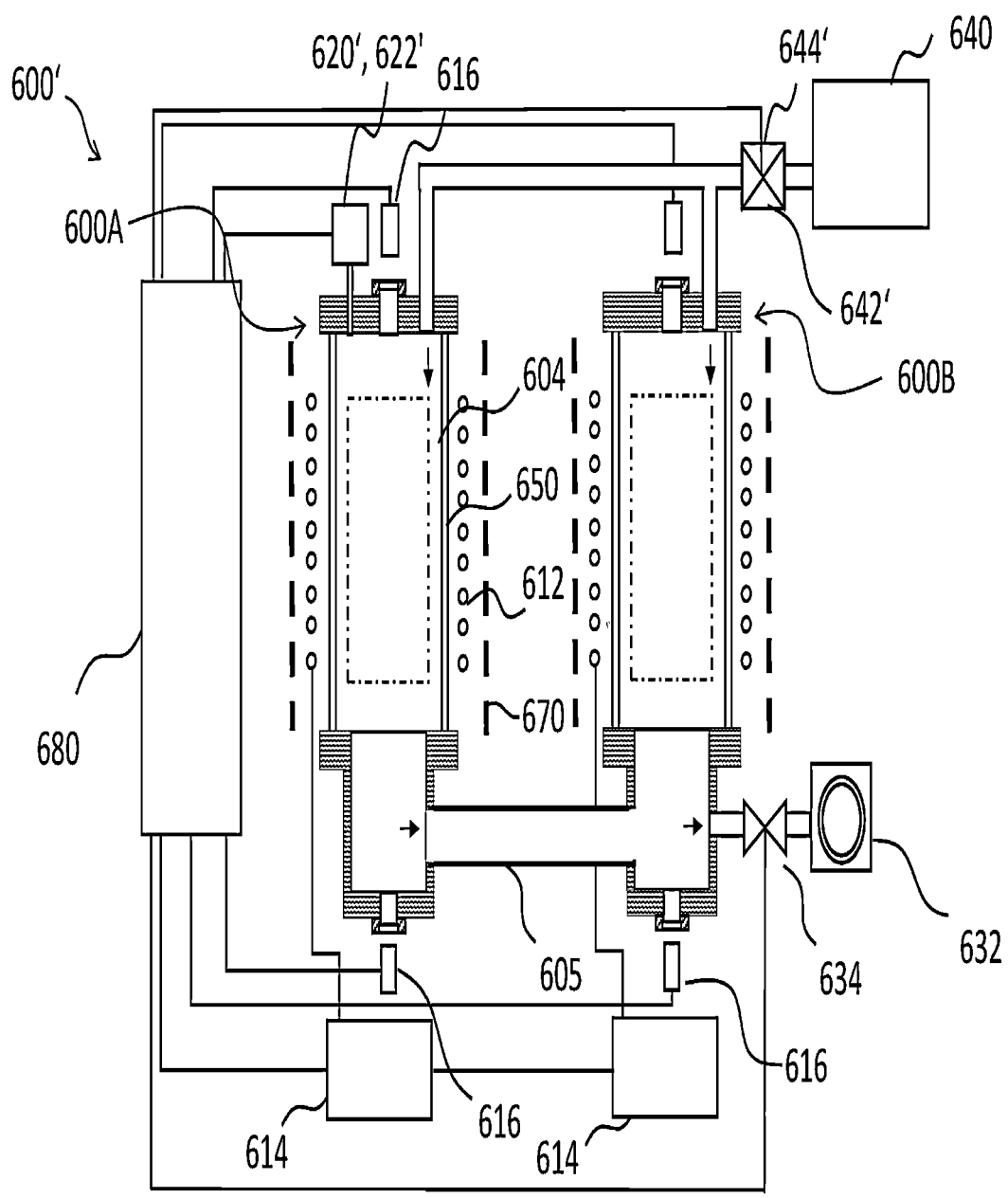
FIG. 7 is a schematic diagram of a PVT growth system having a pair of reactors connected to a common vacuum channel according to another embodiment.

In order to ensure that the amount of doping or inert gases fed to each of the reactors 600A, 600B is substantially the same, the individual control of gas(es) supplied to each reactor 600A, 600B, via the individual control of MFCs 642 may be eliminated and replaced by a common MFC 642', as shown in the PVT growth system 600' of FIG. 7. Referring to FIG. 7, the PVT growth system 600' has essentially the same components as those described with reference to FIG. 6, namely, it comprises two reactors 600A, 600B of a same type connected via the common vacuum channel 605 to the common vacuum pump system 630. A difference of the PVT growth system 600' lies in the doping or inert gases being supplied to each reactor 600A, 600B by a common gas duct 644' under control of the single MFC 642'. The common gas duct 644', in the shown embodiment, is provided on a side of the reactors 600A, 600B opposite to the side where the common vacuum channel 605 is arranged to facilitate distribution of the supplied gases in the inner chambers 604. In addition, the measurement of pressure in the inner chambers 604 is performed by one or more pressure sensors 622' provided on only one of the reactors 600A, 600B.

The pressure sensor(s) 622' measure the pressure at the reactor that is more distant from the reactor directly connected to the vacuum pump system 630 along the common vacuum path 605, which corresponds to reactor 600A in the configuration shown in FIG. 7. The pressure sensor(s) 622', in the shown embodiment, is located to measure pressure on the top side of the reactor 600A. In another embodiment, the pressure sensor(s) 622' may also be provided in a bottom side of the reactor 600A. In this configuration, a same amount of gases of doping or inert gases can be supplied to all reactors simultaneously under control of a same MFC 642', thereby, eliminating supply differences due to slight differences in response from individual MFCs and facilitating the growth process control. Furthermore, measurement and monitoring of pressure inside the inner chambers may be performed by pressure sensors located on only one of the reactors 600A or 600B without significant loss of accuracy, with additional savings on space and equipment costs.

Figure 8:
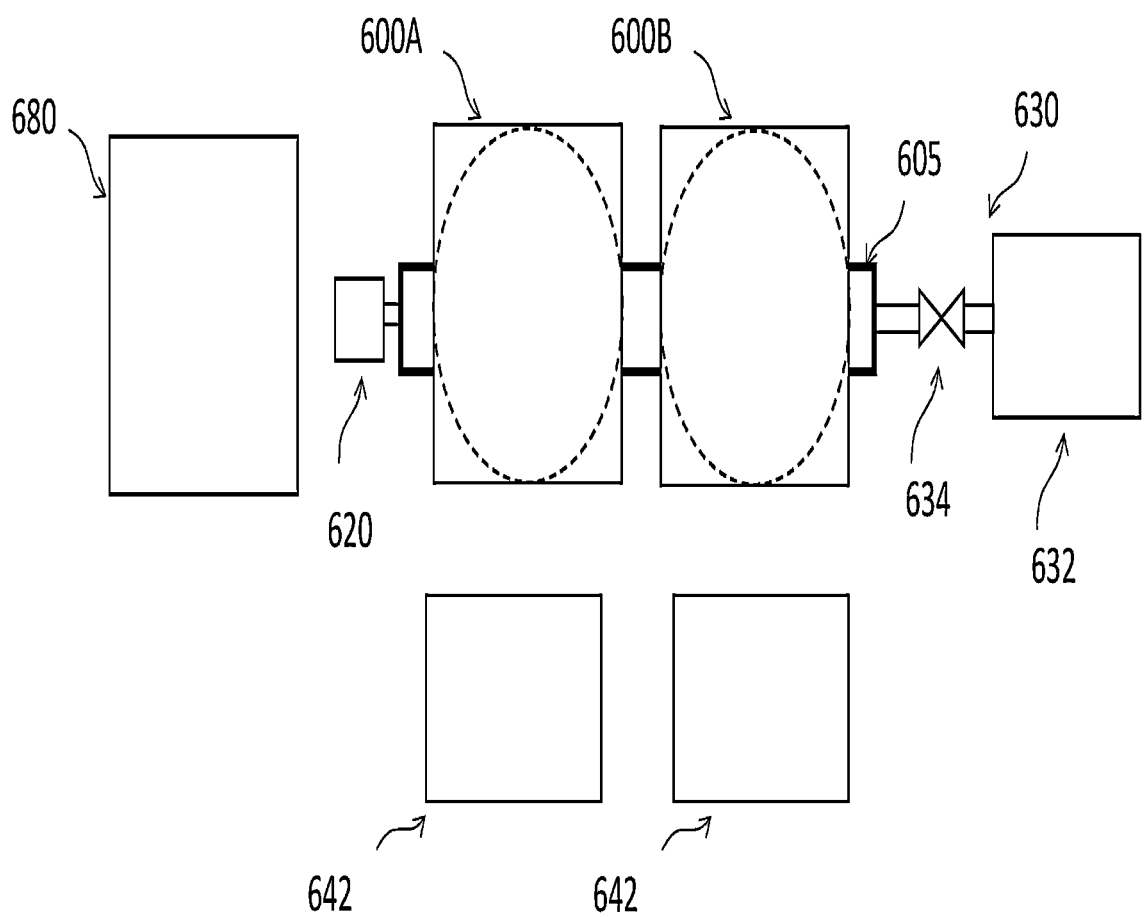
FIG. 8 is a schematic diagram of a common concept of the PVT growth systems shown in FIG. 6 and FIG. 7.

FIG. 8 is a schematic view showing the common concept of the PVT growth systems 600 and 600' described above, in which two reactors 600A, 600B are connected to the common vacuum pump 632 via a common, linear vacuum channel 605 (such as a pipe or tube), the vacuum conditions in each reactor being controlled via the single adjustable control valve 634 by the system controller 680. The pressure measurement system 620 is situated on a side of the common pump channel 605 opposed to the side that is directly connected to the adjustable control valve 624 to measure the pressure reached at the reactor that is more distant from the direct connection to the vacuum pump 632. Because the reactor 600B directly connected to the vacuum pump 632 will achieve a desired pressure more quickly than the reactors distributed along the common vacuum channel 605, it is then ensured that the growth process takes place only when the same vacuum conditions are reached over all of the connected reactors 600A, 600B. In an embodiment, the pressure sensor(s) of the pressure measurement system 620 are arranged to make pressure measurements on the common vacuum channel 605 on a lower region of the connected reactors 600A, 600B.

Figure 9:
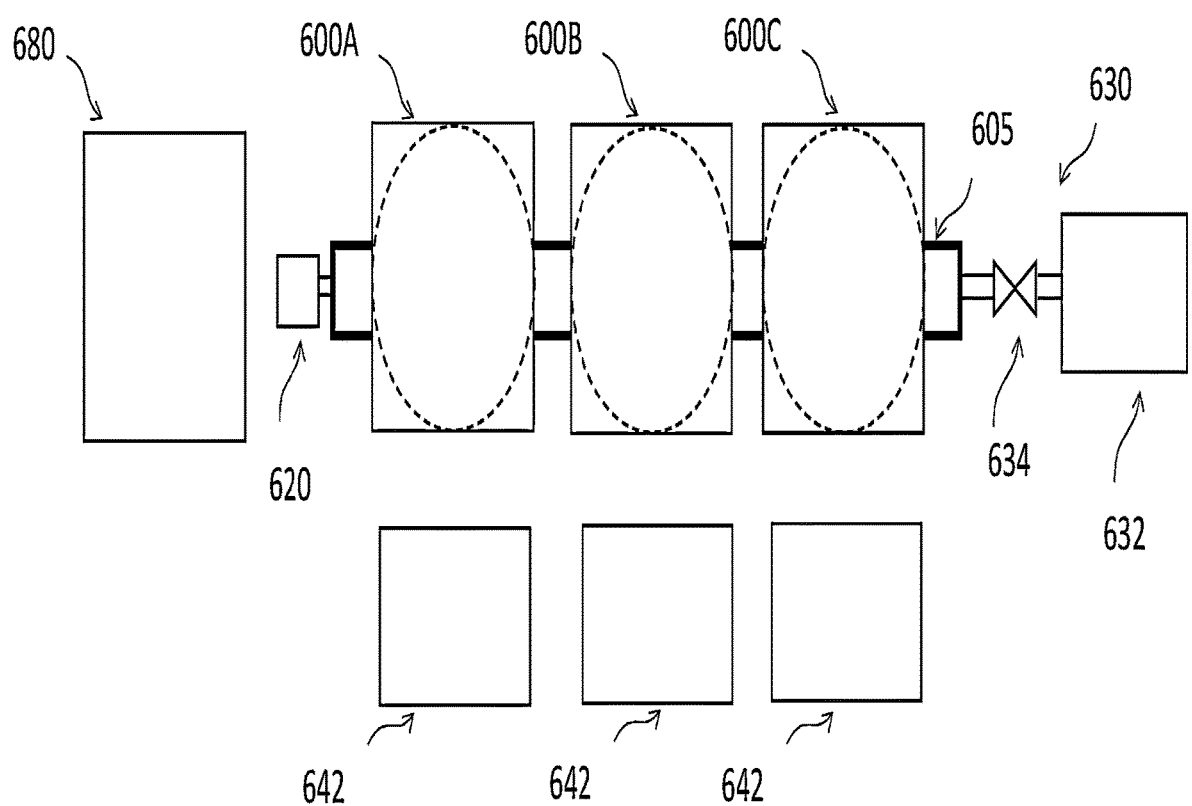
FIG. 9 is a schematic diagram of a PVT growth system having three reactors connected via a linear, common vacuum channel, and an individual current supply for each reactor, according to a further embodiment.

FIG. 9 is a schematic view of a PVT growth system which applies the same concept of FIG. 8 to three reactors 600A, 600B, and 600C that are connected to each other and to the vacuum pump 632 via the same linear, vacuum channel 605. In addition to the advantages of the vacuum condition of all reactors 600A, 600B, and 600C being controlled by a common vacuum pump system, the advantages of a common supply and control of doping/inert gases supply as well as of pressure measurement system common to all reactors may also be applied to a PVT growth structure having three of more reactors.

Figure 10:
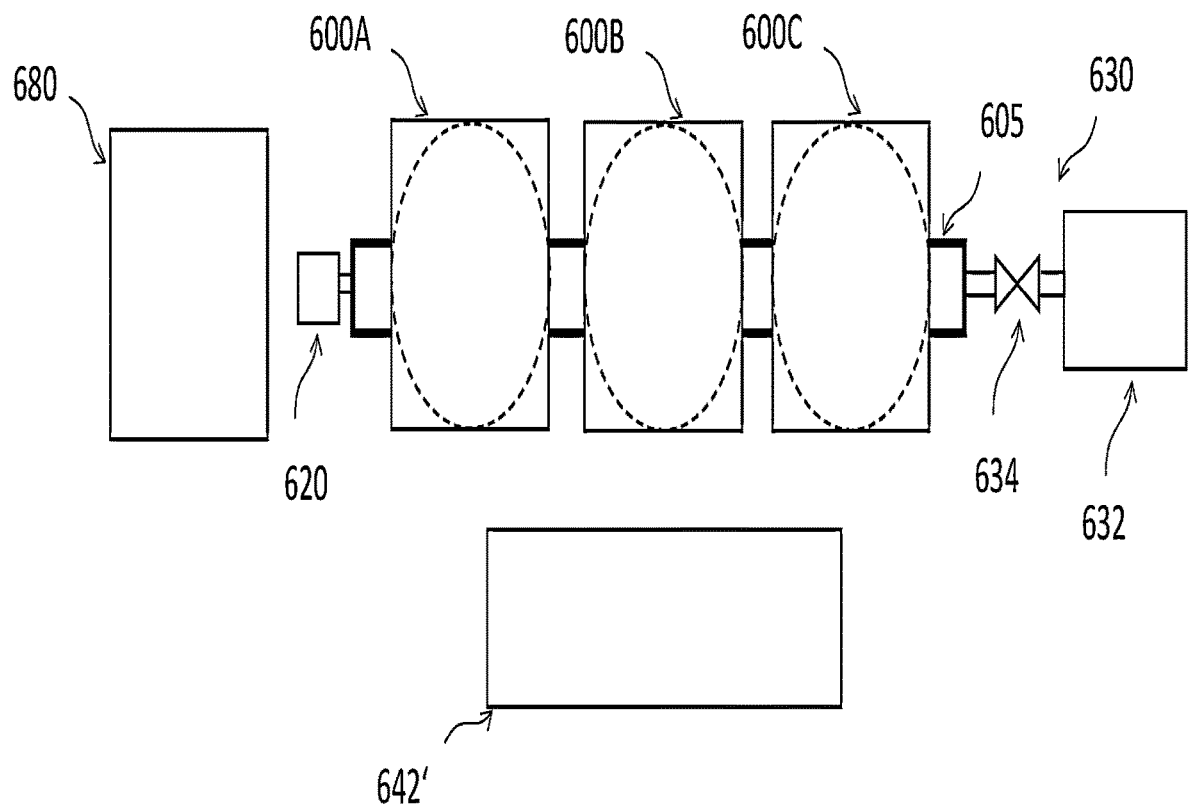
FIG. 10 is a schematic diagram of a PVT growth system having three reactors connected via a linear, common vacuum channel, and a common current supply for supplying current to the three reactors, according to a further embodiment.

FIG. 10 is a schematic view of a PVT growth system which applies the same concept of FIG. 9 to three reactors 600A, 600B, and 600C that are connected to each other and to the vacuum pump 632 via the same linear, vacuum channel 605, and in which the three individual MF generators 614 are provided in a common housing of a mass flux controller 642', which allows additional savings in terms of space and costs.

Figure 11:
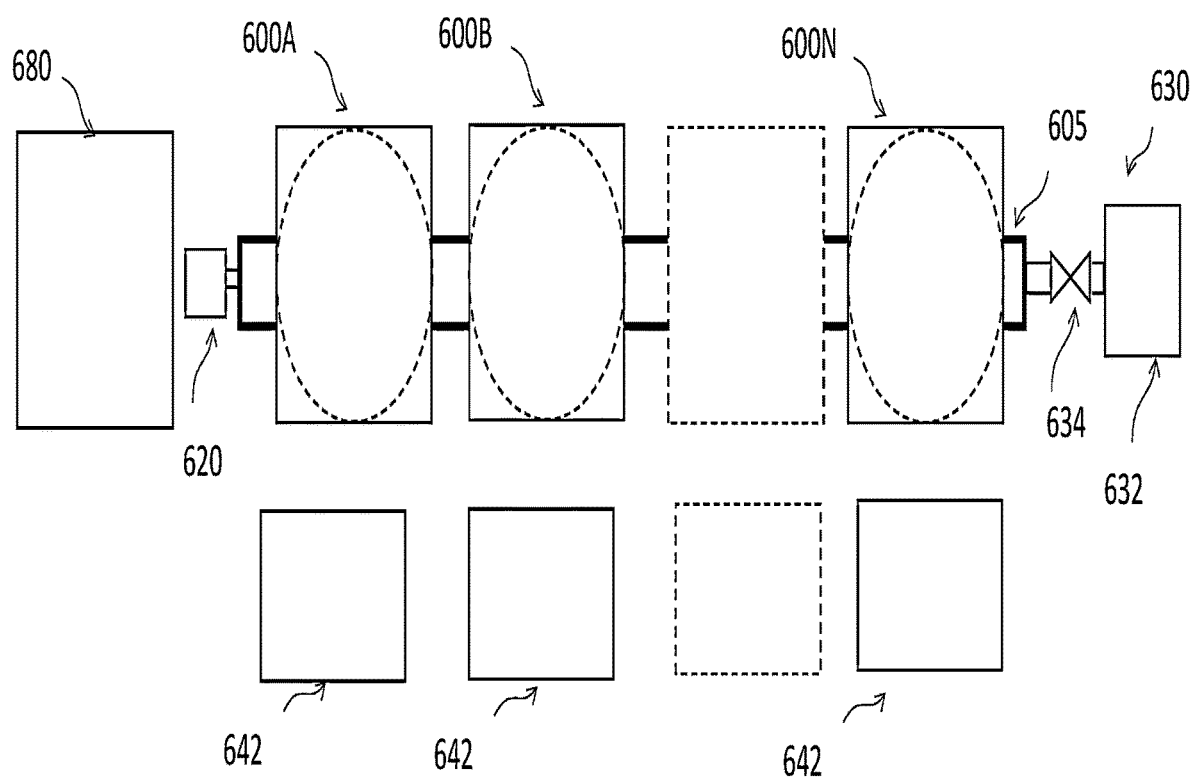
FIG. 11 is a schematic diagram of a PVT growth system having N reactors connected via a linear, common vacuum channel, according to a further embodiment.

FIG. 11 is a schematic view of a PVT growth system which applies the same concept of FIG. 9 to N reactors 600A to 600N that are connected to each other and to the vacuum pump 632 via a same linear, vacuum channel 605'. In this case, the common vacuum channel 605 may be formed by a plurality of vacuum tubes, each provided between any two of the N reactors so that the inner chambers of the N reactors are connected to the vacuum pump system 630 in a serial manner.

Figure 12:
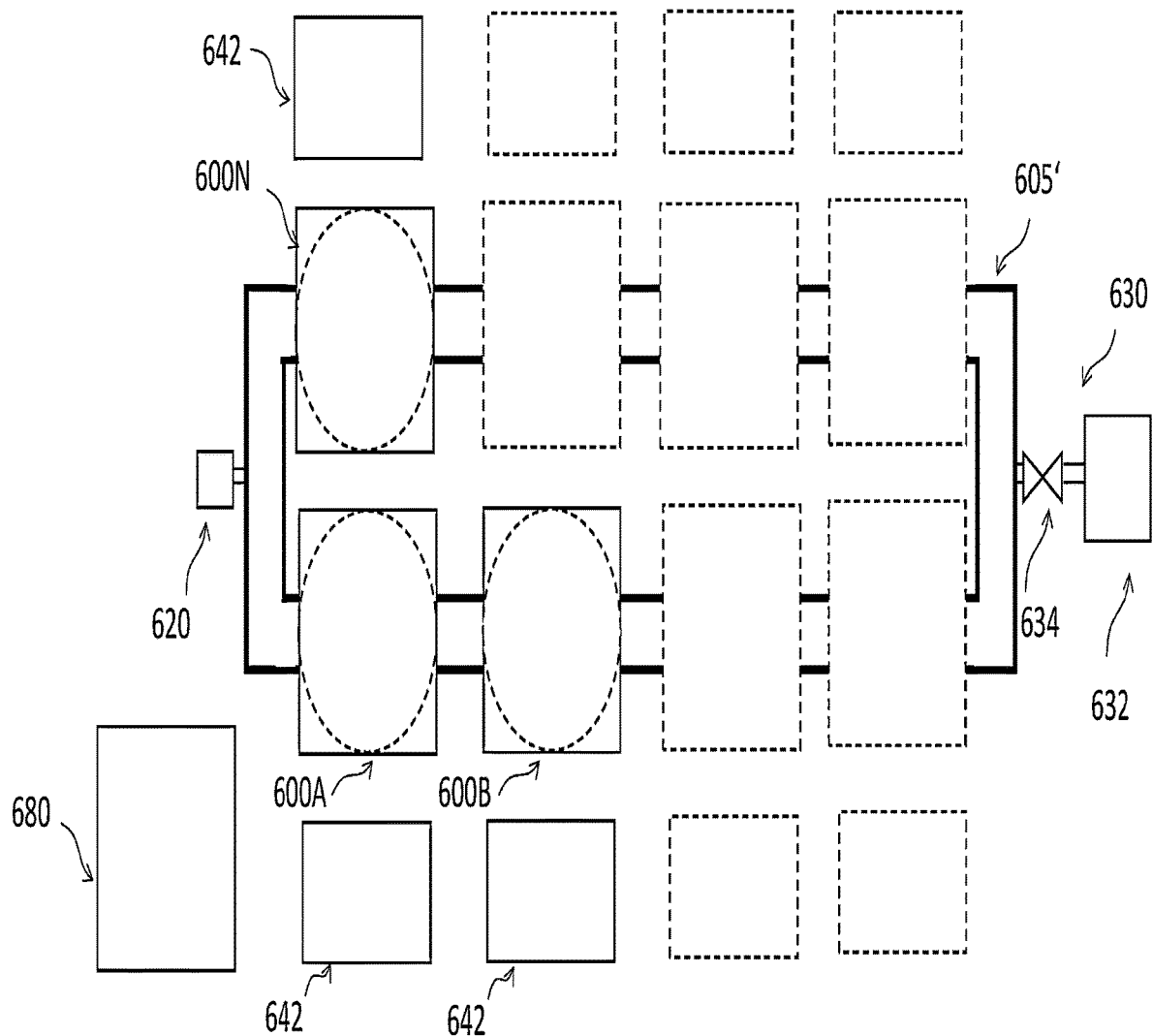
FIG. 12 is a schematic diagram of a PVT growth system having N reactors connected via a ring-shaped, common vacuum channel, according to a further embodiment.

FIG. 12 is a schematic view of a PVT growth system which applies the same concept of FIG. 9 to N reactors 600A to 600N that are connected to each other and to the vacuum pump 632 via a ring-shaped vacuum channel 605'. Similarly to the configuration described above, the pressure measurement system 620 (or pressure sensors) is located on a side of the common vacuum channel 605' which is opposed to the side to which the vacuum pump system 630 is connected so as to ensure that the pressure measurement more accurately reflects the vacuum condition reached inside each of the reactors 600A to 600N.

Figure 13:
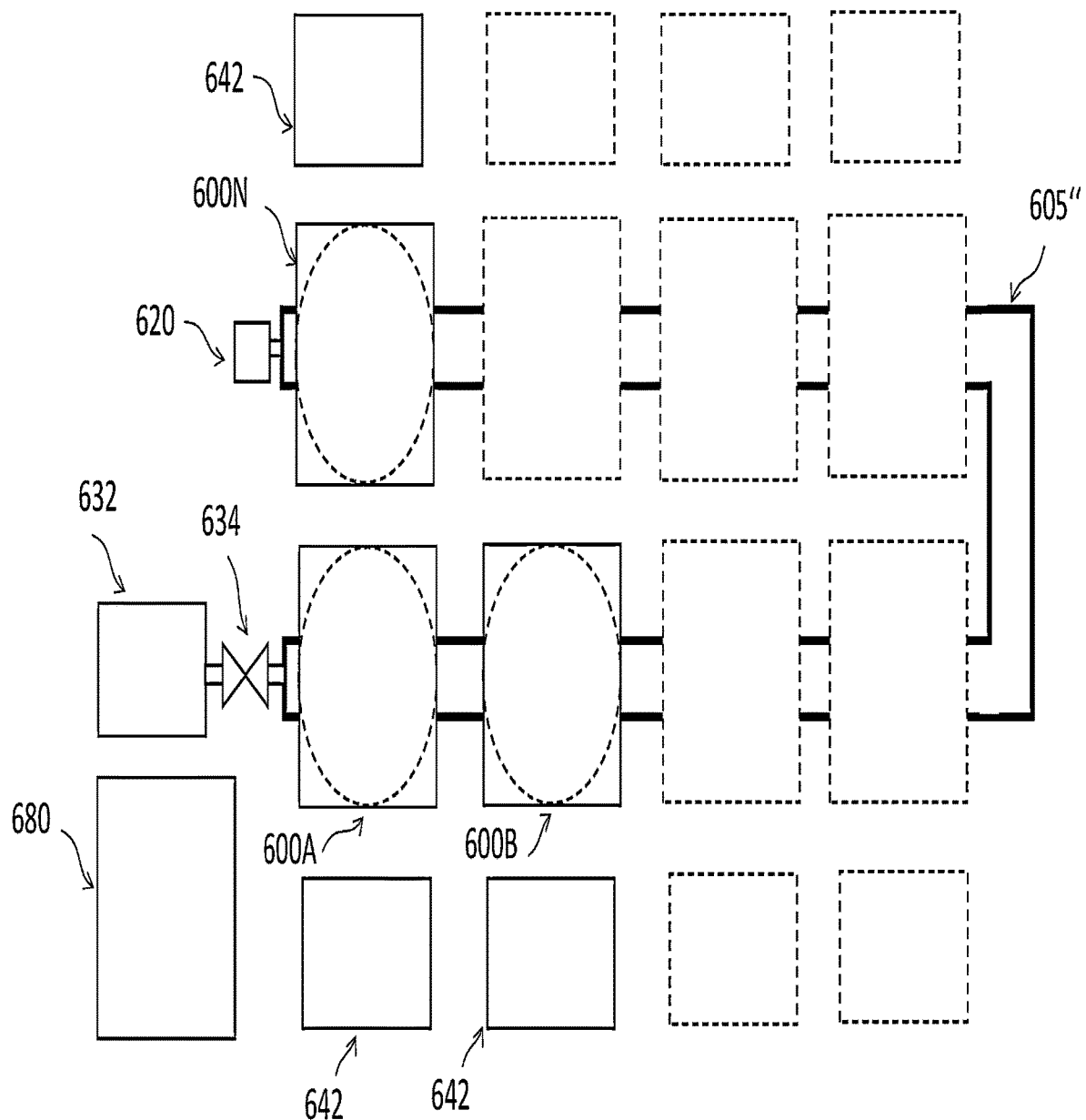
FIG. 13 is a is a schematic diagram of a PVT growth system having N reactors connected via a U-shaped, common vacuum channel, according to a further embodiment.

FIG. 13 is a schematic view of a PVT growth system which applies the same concept of FIG. 9 to N reactors 600A to 600N that are connected to each other and to the vacuum pump 632 via a U-shaped vacuum channel 605". In this configuration, the pressure measurement system 630 (or pressure sensors) is provided on a same side of the common vacuum channel 605" to which the vacuum pump 632 is connected. Nevertheless, due to the serial connection of the reactors 600A, 600B, ... 600N to the vacuum channel 605", the pressure measurement still takes place on the reactor which is the most distant from the connection to the vacuum pump 632 along the vacuum channel 605" (i.e. reactor 600N).

The number N of reactors connected by a common vacuum channel in the PVT growth systems shown in FIGS. 11-13 can be selected as any integer between 2 and 20, and in an embodiment, between 6 and 10. Such a limitation on the number of connected reactors may be desirable to avoid imposing high demands on the exhaustion capabilities of the vacuum pump system 630 while allowing to reach a suitable vacuum condition for the growth process within an acceptable time for most applications. Thus, any of the vacuum pump systems used in conventional PVT growth systems based on the "isolated" reactor concept may be advantageously employed as the vacuum pump system 630 in the PVT growth systems of the present invention. This means that it is possible to simultaneously manufacture more than one semiconductor single crystal boules by making use of conventional PVT growth structures, i.e. without the need of changing the crucible dimensions and/or the amount of source materials, which results in cost savings in comparison with PVT growth systems that use PVT growth structures with an enlarged diameter for enclosing several crystal seeds and an enlarged material source.

On the other hand, the number N of reactors connected to the common vacuum channel does not need to be fixed and may easily be increased or decreased according to need by simply adding or removing the vacuum connections of the additional or unnecessary reactors to the common vacuum channel.

In the embodiments described above with reference to FIGS. 9-13, pressure in the inner chambers of the connected reactors is measured and/or monitored on the common vacuum channel 605 on a lower region of the connected reactors 600A to 600C.

The present invention provides a novel concept of PVT growth systems for simultaneously manufacturing more than one semiconductor single crystal boules, in which two or more reactors are connected by a common vacuum channel and controlled in a centralized manner to reach substantially the same growth conditions. The connection of the reactors to the same pump system via the common vacuum channel allows to ensure that substantially the same vacuum conditions are reached in all of the connected reactors before start of the growth process as well as to achieve and maintain suitable predetermined conditions of the inert and/or doping gas phase in the inner chambers (i.e. gas phase pressure and/or composition) during the growth process. In addition, since the PVT growth systems of the present invention may be also provided with a common gas supply to feed the doping or inert gases into the reactor chambers, it is easier to achieve and maintain the same composition of the gaseous compounds in the growth chamber over all of the connected reactors. For instance, semiconductor single crystal boules can be simultaneously manufactured with very similar doping levels, which has a high impact in the resistivity of the semiconductor properties.

Therefore, the present invention makes possible to increase the rate of production of semiconductor single crystals with homogeneous high quality, thereby reducing losses due to rejection, in comparison with semiconductor single crystals manufactured in PVT growth systems based on the "isolated" reactor concept. The above advantages of the present invention also have impact in terms of costs and space, since several reactors may be controlled simultaneously using a single vacuum system, gas supply system, and system controller that are common to all connected reactors, and in space saving arrangements.

Though certain features of the above exemplary embodiments were described using terms such as "top", "bottom", "lower" and "upper", these terms are used for the purpose of facilitating the description of the respective features and their relative orientation within the PVT growth system only and should not be construed as limiting the claimed invention or any of its components to a particular spatial orientation.

TABLE 1

| Reference Signs | |
| --- | --- |
| 100, 200 | PVT growth structure |
| 102, 202 | Crucible |
| 104, 204 | Source material compartment |
| 106, 206 | Source material |
| 108, 208A, 208B | Seed crystal(s) |
| 110, 210A, 210B | Growth compartment(s) |
| 112, 212A, 212B | Heat dissipation channel(s) |
| 114, 214 | Thermal insulation layer(s) |
| 116, 216 | Longitudinal axis |
| 300, 300', 300" | PVT growth system |
| 302, 302', 302", 602 | Reactor |
| 304, 304', 304", 604 | Inner chamber |
| 306" | Reactor metal walls |
| 310, 610 | Inductive heating system |
| 312, 612 | Induction coil |
| 314, 614 | MF generator/inverter |
| 316, 616 | Temperature sensors |
| 320, 620, 620' | Pressure measuring system |
| 622, 622' | Pressure sensor(s) |
| 330, 630 | Vacuum pump system |
| 332, 632 | Vacuum pump |
| 334, 634 | Adjustable control valve |
| 340, 640 | Gas supply |
| 342, 642, 642' | MFC (mass flux controller) |
| 350, 650 | Water cooling system |
| 352, 354, 352", 354" | Concentric glass tubes |
| 356" | Current control unit |
| 360" | Resistive heating system |
| 362", 364" | Resistive elements |
| 366" | Heating current control unit |
| 370, 670 | Shield |
| 380, 680 | System controller |
| 644' | Common gas supply duct |
| 600 | PVT growth system |
| 600A, 600B, 600C | Reactor(s) |

TABLE 1-continued

| Reference Signs | |
| --- | --- |
| 604 | Inner chamber |
| 605, 605', 605" | Common vacuum channel |

What is claimed is:

1. A method for simultaneously manufacturing more than one single crystal of a semiconductor material by physical vapor transport (PVT), the method comprising:
    connecting a pair of reactors to a vacuum pump system by a common vacuum channel, each reactor having an inner chamber adapted to accommodate a PVT growth structure for growth of a semiconductor single crystal; and
    creating and/or controlling, with the vacuum pump system, a common gas phase condition in the inner chambers of the pair of reactors;
    wherein each of the reactors includes a gas feed to supply doping and/or gaseous compounds, from a gas supply, to the inner chamber;
    wherein the PVT growth structure includes a crucible having a source material compartment containing a source material and at least one crystal seed arranged in a respective growth compartment of the PVT growth structure for growing at least one single crystal from the source material; and
    wherein the pair of reactors are connected to the common vacuum channel in a serial manner so that one of the reactors is directly connected to the vacuum pump system and the other of the reactors is evacuated, by the vacuum pump system, via the common vacuum channel.

2. The method of claim 1, further comprising measuring a pressure of the gas phase condition reached in the inner chambers of the pair of reactors using a pressure sensor arranged in at least one of the pair of reactors.

3. The method of claim 2, further comprising monitoring the pressure and outputting a plurality of vacuum control parameters for controlling the vacuum pump system.

4. The method of claim 3, further comprising outputting a plurality of gas phase control parameters for controlling a gas supply system to feed gaseous components that form the gas phase condition in the inner chambers to reach and maintain substantially a same, predetermined gas phase condition in all connected inner chambers, the gas phase condition includes a pressure and/or a composition of the gas phase.

5. The method of claim 2, wherein the pressure sensor measures the pressure at a reactor of the pair of reactors that is more distant from a connection to the vacuum pump system along the common vacuum channel.

6. The method of claim 2, wherein the pressure sensor measures the pressure on the common vacuum channel on a lower region of the pair of reactors.

7. The method of claim 1, further comprising controlling a plurality of parameters of a PVT growth process in the pair of reactors using a common system controller.

8. The method of claim 7, wherein the parameters include at least one of a pressure inside the inner chambers of the reactors, a growth temperature, and a gas supply of doping and/or inert gases to the inner chambers that form the gas phase condition.

9. The method of claim 1, wherein the source material is a semiconductor material selected from a group including at least silicon carbide, 4H-SiC, and a semiconductor of group III-V elements.

10. The method of claim 1, further comprising displacing a movable bottom flange of at least one of the pair of reactors with respect to a longitudinal axis of the reactor for bringing the PVT growth structure into the inner chamber from a lower side.

11. The method of claim 1, further comprising heating the PVT growth structure arranged in each reactor with a heating system and dissipating heat from each reactor with a cooling system.

12. The method of claim 11, wherein the heating system is one of an inductive-heating system and a resistive-heating system.

13. The method of claim 12, wherein the cooling system is one of or a combination of a water cooling system and an air cooling system.

14. The method of claim 1, wherein the pair of reactors are arranged such that the common vacuum channel has one of a U-shape and a ring-shape.

15. The method of claim 1, wherein each of the reactors includes a heating system associated with the reactor and adapted to heat the PVT growth structure arranged inside the inner chamber.

* * * * *